(12) United States Patent
Walesa

(10) Patent No.: US 7,035,115 B2
(45) Date of Patent: Apr. 25, 2006

(54) MULTI-AXIS MOTOR CONTROL WITH HIGH VOLTAGE BACKPLANE

(75) Inventor: Phillip John Walesa, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 382 days.

(21) Appl. No.: 10/412,782

(22) Filed: Apr. 11, 2003

(65) Prior Publication Data
US 2004/0201972 A1    Oct. 14, 2004

(51) Int. Cl.
*H05K 7/10*  (2006.01)
(52) U.S. Cl. ............. 361/788; 361/732; 361/775; 307/147
(58) Field of Classification Search ........ 361/729–733, 361/775, 778, 788; 318/575; 307/147
See application file for complete search history.

(56) References Cited

U.S. PATENT DOCUMENTS

| | | | | |
|---|---|---|---|---|
| 3,241,000 A | * | 3/1966 | Roslyn, Jr. .................. 361/683 |
| 4,511,950 A | * | 4/1985 | Bunner et al. .............. 361/788 |
| 4,685,032 A | * | 8/1987 | Blomstedt et al. .......... 361/803 |
| 4,738,632 A | * | 4/1988 | Schmidt et al. ............. 439/341 |
| 5,655,922 A | * | 8/1997 | Dux et al. ................... 439/213 |
| 6,654,255 B1 | * | 11/2003 | Kruse et al. ................ 361/799 |

* cited by examiner

*Primary Examiner*—John B. Vigushin
(74) *Attorney, Agent, or Firm*—Quarles & Brady, LLP; Alexander M. Gerasimow

(57) ABSTRACT

A backplane for a motor controller having a control module and one or more axis modules provides both low power and low powered signals and high power used to produce motor drive signals.

31 Claims, 4 Drawing Sheets

MULTI-AXIS MOTOR CONTROL WITH HIGH VOLTAGE BACKPLANE

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates to motor control systems, and in particular, to a motor control system providing a convenient backplane for interconnecting motor control modules.

Multi-axis motor controllers are used in industrial automation and manufacturing systems such as conveyer lines and multi-axis machine tools which require coordinated control of multiple motors. Generally, these systems include a main control module coupled to an axis control module for each motor of the system. The main control module is programmable to provide independent control of the system or may receive external commands over a high-speed communication link from a programmable logic controller (PLC) or the like. The main control module provides power and command signals to the individual axis control modules which process the power and, according to the command signals, provide drive signals to the associated motors. Feedback signals from the motors may be received by the axis control modules to provide more sophisticated feedback control of the motors and may be communicated to the main control module.

The number of axis control modules may be varied to allow the motor control system to be flexibly configured to applications requiring different numbers of motors. The main control module and the axis control modules are typically mounted adjacent to each other with their rear faces attached to a panel. Data signals (for example, command signals) may be exchanged between the main control module and the axis control modules (collectively "motor control modules") on ribbon cables or on a backplane having a number of parallel conductors carried on a printed circuit board supporting electrical connectors attaching to corresponding connectors on the motor control modules.

The power necessary to drive the motors is normally provided by separate connections between the motor control modules either using large-gauge point-to-point wiring or metal bus bars extending between the modules, typically connecting along the top or from sides of the modules with screw fasteners. The wires or bars and their connection points must be properly insulated to protect users against the high voltages typically employed. Connecting and disconnecting the motor control modules from power is time consuming.

An improved interconnection system for motor control modules is described in U.S. Pat. No. 5,493,194 entitled "Control Signal and Power Bus Connector Arrangement for a Multi-Axis Motor Control" assigned to the same assignee as the present invention and hereby incorporated by reference. In this system, parallel conductor segments are built into the front of each motor control module. Each conductor segment includes connectors on its right and left sides so that it may be joined to other connector segments on adjacent motor control modules. As the motor control modules are assembled, their connector segments are joined creating a path of power and data communication between the motor control modules. The conductor segments incorporate electrical shielding and may slide laterally along the face of their respective motor control modules, to a limited degree, to allow motor control modules to be individually engaged and disengaged with other motor control modules after the motor control modules are mounted to the panel.

This approach provides a number of advantages including the ability to rapidly connect and disconnect multiple motor control modules and the ability to easily connect different numbers of motor control modules. Nevertheless, one disadvantage to this approach is that the depth (from rear to front face) of each motor control module must be similar so that the connector segments align and can be engaged. This requirement limits flexibility in designing smaller motor control modules that take advantage of reductions in electrical component size and/or interconnecting motor control modules of different generations having different form factors.

BRIEF SUMMARY OF THE INVENTION

The present invention provides a backplane for communicating both data and power among the motor control modules. By moving the connection point between motor control modules to the rear surface of the motor control modules, the depth of the modules need not be tightly constrained. The connectors, engaging and disengaging along a direction perpendicular to the backplane, make installation or removal of individual modules easy.

The backplane structure can be economically manufactured in a variety of different sizes to allow motor control systems with different number of axis control units. Further, the backplane makes it easier to isolate the high power conducted between the motor control modules from operator contact, and greatly reduces electromagnetic interference from the high power conductors by placing the high power conductors between a ground plane of the backplane and metal housings of the motor control modules. The benefits of the prior art in simplifying the wiring of power and eliminating the possibility of mis-wiring are nevertheless preserved.

Specifically, the present invention provides a motor control system having at least one motor control module generating a drive signal for controlling an electric motor. The motor control module has a rear face exposing a transversely extending first connector for receiving electrical power to produce the drive signal and receiving data signals for controlling the drive signal. The system also includes a backplane having an insulating support holding a set of high power conductors extending longitudinally along the insulating support, each providing power transmission capacity in excess of 1000 Watts. The insulating support also holds a set of low power conductors displaced from the high power conductors and extending longitudinally along the insulating support. The second connectors are spaced longitudinally along the insulating support and span and join with the high and low power conductors and are each joinable with one of the first connectors.

Thus, it is one object of the invention to provide a system for simply and rapidly connecting both data and high power wiring between the motor control modules. Only one connection operation is required for data, low power and high power, and the connection may be performed without the need to move or disconnect adjacent motor control modules. It is a further object of the invention to provide an interconnect offering great flexibility in the form factor of motor control modules.

The high power conductors may be discrete metal bars and the low power conductors may be traces on a printed circuit board.

Thus, it is another object of the invention to accommodate the extremely high current flow necessary in a motor control application without multilayer or expensive, thickly clad, printed circuit board material.

The insulating support may provide grooves to receive the metal bars to provide insulating material therebetween.

Thus, it is another object of the invention to provide a system for supporting and insulating the metal bars to reduce possible arcing of high voltage.

The second connectors may include rearwardly extending pins press fit into corresponding holes in the metal bars to electrically join the pins to the metal bars without soldering.

Thus, it is another object of the invention to provide an assembly technique for connecting connectors to the metal bars that can be done rapidly without the necessity of heating the bars such as would make conventional mass production soldering techniques difficult.

The second connectors may include rearwardly extending pins press fit into corresponding plate-through holes, the printed circuit board communicating with traces to electrically join the pins to the traces on the printed circuit board without soldering.

Thus, it is another object of the invention to provide a single connection technique for all conductors on the backplane.

The power conductors may have three conductors providing independent ground and power lines.

Thus, it is another object of the invention to provide for a high current power and ground pathways.

The printed circuit board may include traces on the front and back sides.

Thus, it is another object of the invention to provide a compact multi-wire bus structure for logic and logic level signals.

The printed circuit board may include plate-through holes joining selected corresponding traces on the front and back sides in parallel.

Thus, it is another object of the invention to provide a simple means of increasing the current carrying capacity for low-level power without the need for thickly clad printed circuit board material.

The low power conductors may include at least one conductor joining each of the second connectors to provide a common serial communication line, and the motor control modules may include serial communication circuitry, such as but not limited to, CAN protocol circuitry.

Thus, it is another object of the invention to provide for complex data communication between the modules with limited interconnect wiring.

The backplane may include a cover insulating sheet over the low and high power conductors and may include apertures for exposing the second connectors.

It is another object of the invention to enclose the high power conductors against possible contact with operator or other materials.

The motor control system may include a hanger system on the backplane and motor controller modules supporting the weight of the motor controlled modules independently of the joining of the first and second connectors.

Thus, it is another object of the invention to permit a simple connector operating in a vertical orientation without the need for complex mechanical locks and the like on the connector.

The hanger system may be a hook and catch, one part at an upper edge of the rear face of the motor control module engaging the other part at the upper edge of the backplane, allowing a pivoting joining of the first and second connectors about a pivot point at the hook and catch.

Thus, it is another object of the invention to provide support for the motor control modules that assists in connecting the motor control modules to the backplane by allowing a lever-type engagement about the hanger pivot.

The rear face of the motor control module may support a screw engaging a threaded hole in the backplane to lock the motor control module into position.

Thus, it is another object of the invention to provide a positive attachment of the motor control modules to the backplane.

The screw may be an extension screw passing through the motor control module to have a screw head accessible at a front of the control module.

Thus, it is another object of the invention to provide a screw interlock without necessarily limiting the vertical height of the module.

The backplane may include a metal plate positioned behind the insulating support providing a ground plane to the high and low power conductors. The housings of the motor control modules may be conductive and connected to the ground plane.

Thus, it is another object of the invention to provide a system that reduces electromagnetic interference that may be present on the high power conductors.

The low power conductor may include a series conductor connecting each of the second connectors and the first connectors may include a shorting conductor providing continuity to the series conductor when each of the second connectors is joined to a first connector.

Thus, it is another object of the invention to provide a system of ensuring that the backplane is fully covered either by motor control modules or dummy modules to prevent access to the high power conductors of the backplane.

The insulating support may be modular to support at least one second connector and its associated high power conductors and low power conductors.

It is thus another object of the invention to provide a variable length backplane system that is cost effective when compared with the prior art modular bus structure.

The metal plate may include an alignment surface interfitting with a corresponding alignment surface of the motor control module to guide the motor control module into alignment with the second connector prior to engagement of the first and second connectors.

It is another object of the invention to provide a system that insures alignment of the first and second connectors without visual confirmation such as may be difficult to obtain on the backplane system.

These particular objects and advantages may apply to only some embodiments falling within the claims and thus do not define the scope of the invention.

DETAILED DESCRIPTION OF THE PREFERRED EMBODIMENT

Figure 1:
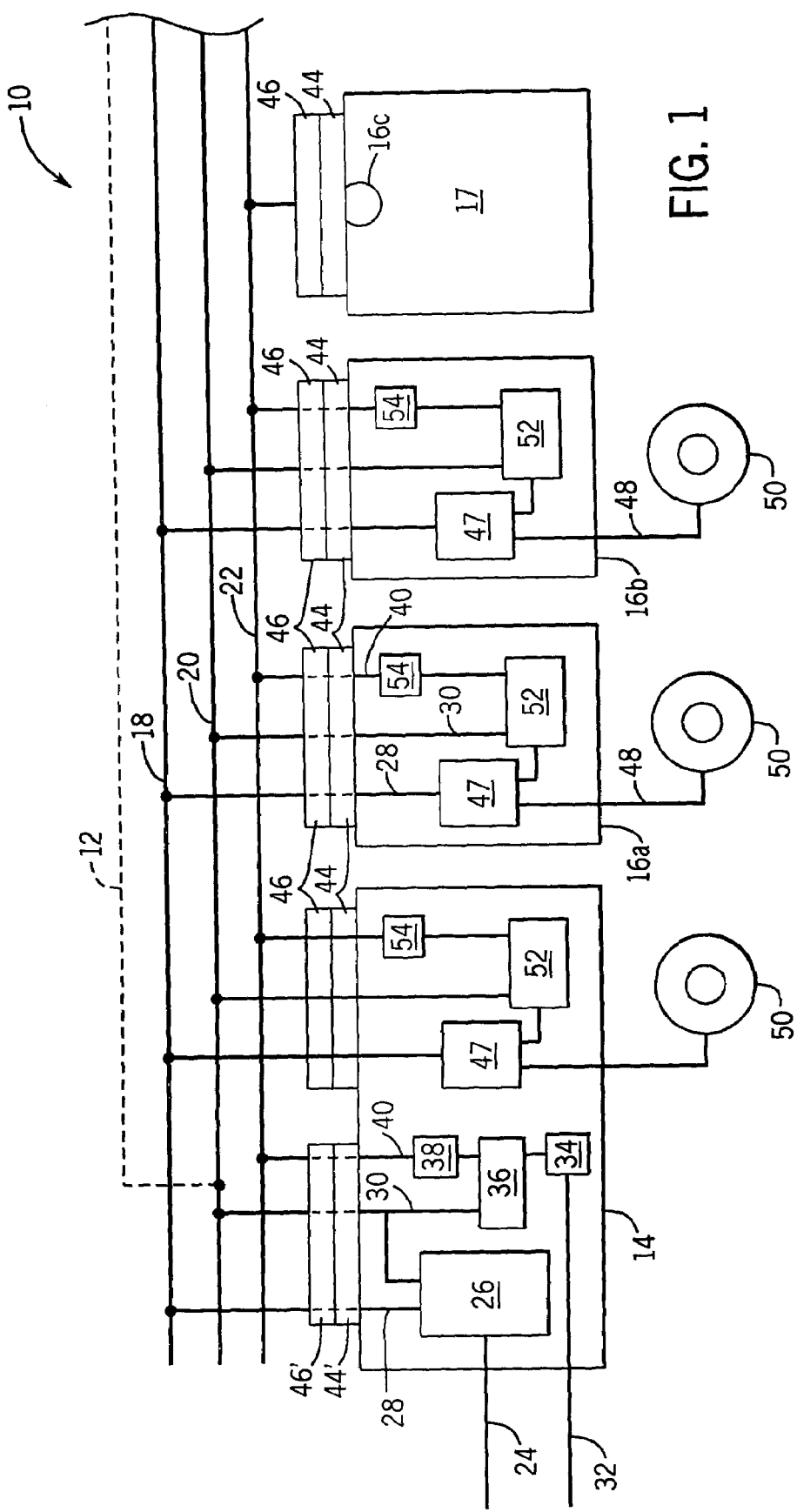
FIG. 1 is a schematic diagram of a motor control system having a main control module and two axis control modules and a dummy module connected to a high power backplane.

Referring to FIG. 1, a motor control system 10, according to the present invention, employs a backplane 12 interconnecting a main control module 14 and one or more axis modules 16a and 16b and optionally one or more dummy modules 17. The main control module 14 also includes the components of an axis control module so as to operate independently as a single axis controller 16 as will be described below with respect to the axis controllers 16.

The backplane 12 includes three separate conductor sets: a high power conductor set 18, a low power conductor set 20, and a data conductor set 22. The motor control modules 14, 16, and 17 communicate electrically with one or more of the conductor sets of the backplane 12 via module connectors 44, attached to the rear faces of the motor control modules 14, 16, and 17. The module connectors 44 connect to corresponding backplane connector 46 communicating with the conductor sets 18, 20, and 22 of the backplane 12.

The main control module 14 receives a source of external power 24 at an internal power supply 26 to produce high power 28 and low power 30. The low power 30 is used internally to provide power to a processor 36 and other circuitry including a first serial interface 34 and a second serial interface 38.

A high-speed serial network 32 may also be received by the main control module 14 from a remote terminal or a programmable logic controller. Data from this network 32 may be forwarded to the other axis control modules 16 as will be described, or used by the processor 36 in an independently executing control program. The high-speed serial network 32 may be received by a serial interface 34, for example, an Ethernet serial interface and conveyed to the processor 36. The processor 36 may forward the received data and/or other data to a second serial interface, for example, a CAN serial interface which produces serial data 40.

The high power 28, low power 30, and serial data 40 are communicated, respectively, with the high power conductor set 18, low power conductor set 20, and data conductor set 22 through module connectors 44 and corresponding backplane connectors 46. The data conductor set 22 also communicates other low power data signals (not shown).

In a manner analogous to that of main control module 14, the axis control modules 16a and 16b (and the axis controller contained in the main control module 14) receive high power 28, low power 30, and serial data 40 through module connectors 44 and corresponding backplane connectors 46. The high power 28 is received at an inverter 47 controllable to provide a motor signal 48 to a motor 50 according to methods well known in the art. The inverter 47 is controlled by an internal processor 52 which receives low power 30 and serial data 40 as processed by a serial interface 54 connected to the backplane 12.

Figure 2:
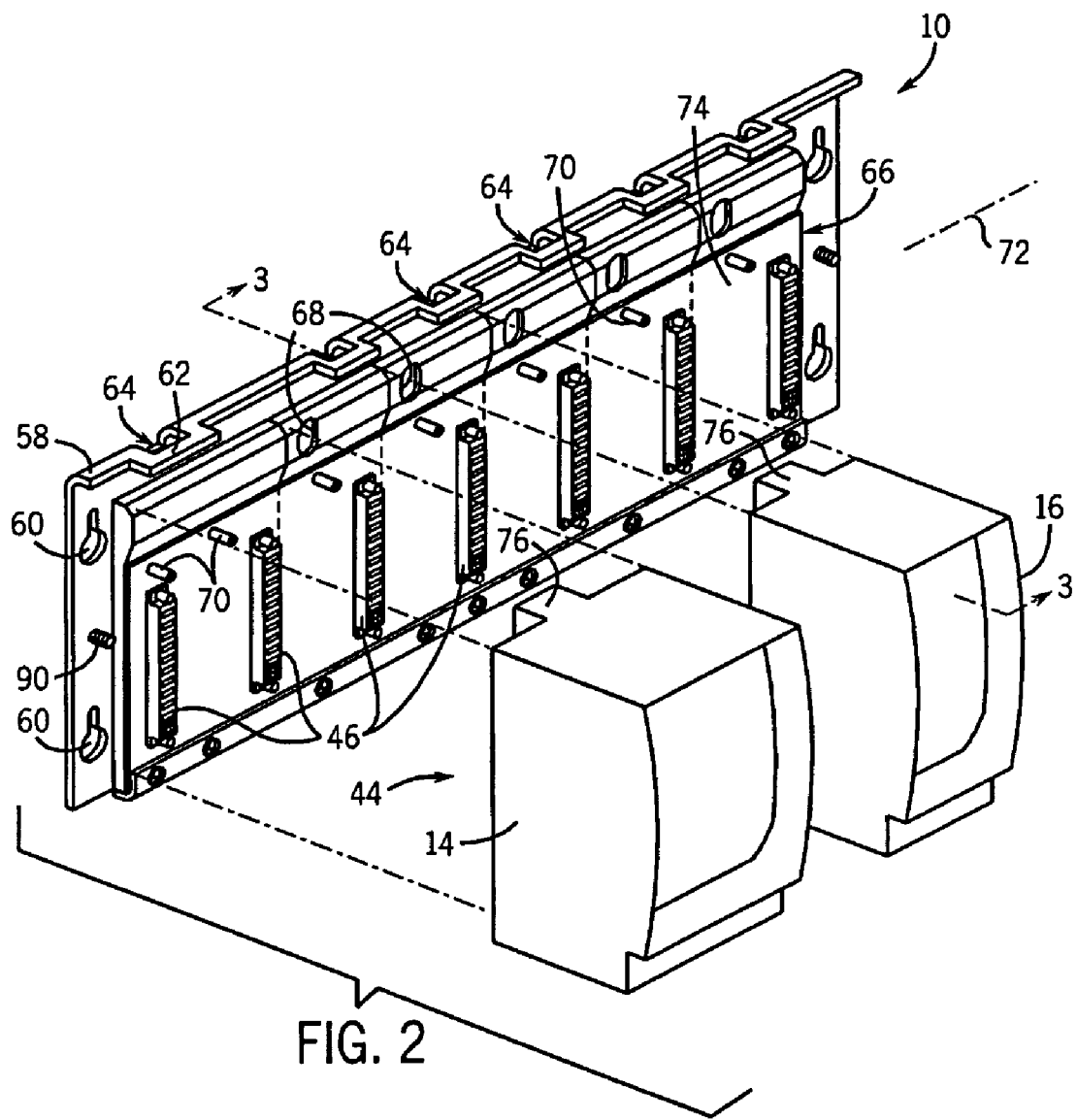
FIG. 2 is an exploded perspective view of the backplane showing a main control module and one axis control module before connection to the backplane.
Figure 4:
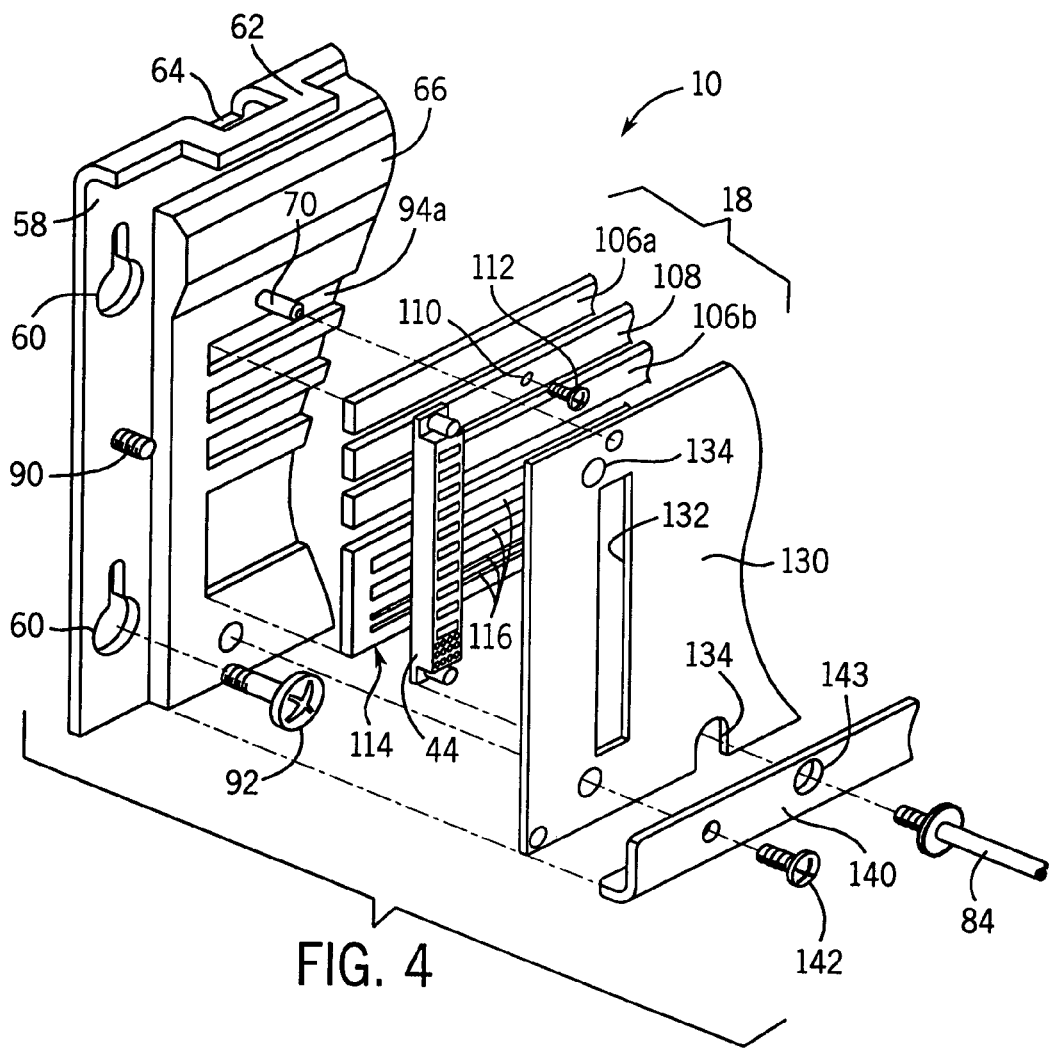
FIG. 4 is a fragmentary exploded perspective view of the backplane of FIG. 2 showing a metal support plate holding an insulating support for high and low power conductors and an insulating cover sheet.

Referring now to FIGS. 2 and 4, the backplane 12 may include a metal support plate 58 having one or more mounting holes 60 for attaching the metal support plate 58 to the back of a cabinet or other panel. The metal support plate 58 may be grounded by a grounding lug 90 or by means of several screws 92 passing through the mounting holes 60 to be received by a grounded metal cabinet or the like.

Catch plates 62 extend horizontally from an upper edge of the metal support plate 58, each having openings 64 at the corner between the catch plate 62 and the remaining vertical extent of the metal support plate 58. Each catch plate defines a station that may receive one of the modules 14, 16, and 17. The stations generally extend along a longitudinal axis 72 typically being in the horizontal plane.

Alternatively, the function of the metal support plate 58 may be satisfied by a metal cabinet or the like (not shown) and the catch plate may be a separate strip mounted directly to the cabinet.

Figure 3:
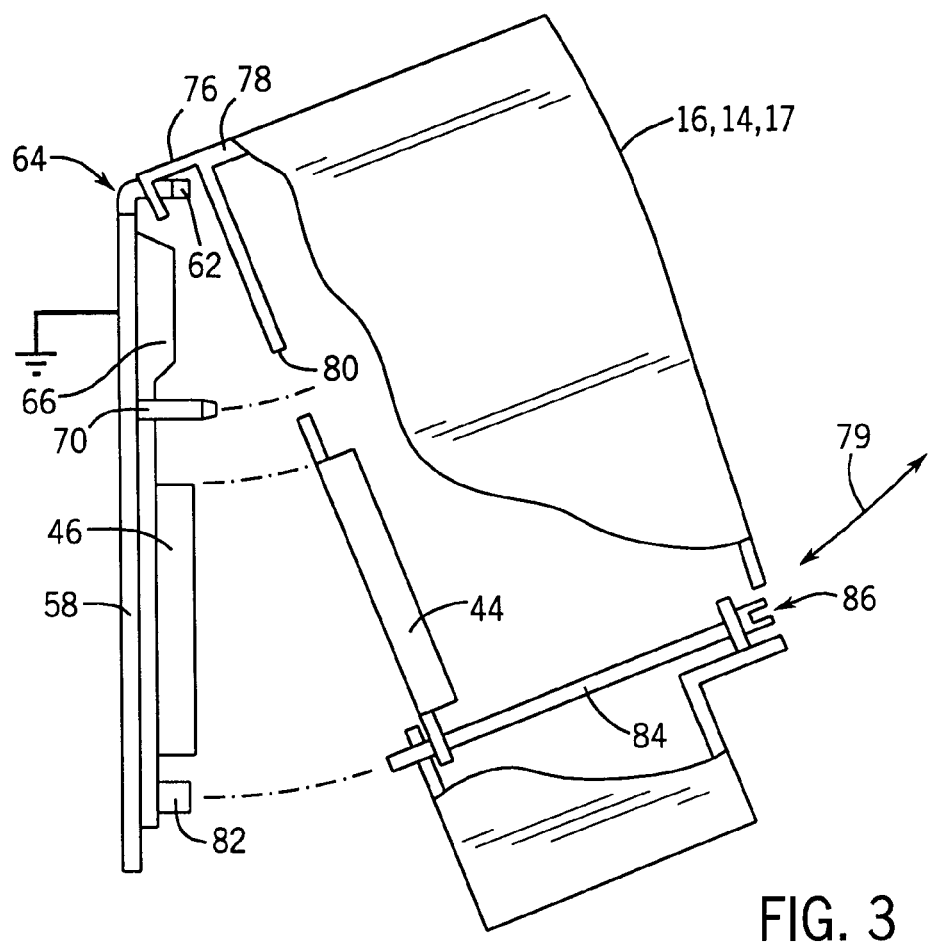
FIG. 3 is a side elevational cross-section along line 2—2 of FIG. 2 showing a hanger system for supporting the motor control modules of FIG. 2 allowing pivotal engagement of the connectors of the backplane and motor control modules.

Referring now to FIGS. 2 and 3, the upper rear edge of the main control module 14 and axis control modules 16 (a dummy module 17, not shown) may include a rearward and downwardly extending hook 76 that may engage the openings 64 of the horizontal catch plates 62 formed from the metal support plate 58. The horizontal catch plates 62 guides the hooks 76 as they are slid toward the backplane 12 to find the openings 64.

The housing 78 of the main control module 14, the axis control modules 16, and the dummy modules 17 may be metallic or otherwise conductive and connect electrically via the hook 76 and the horizontal catch plates 62 to the metal support plate 58 to provide an electrical grounding of the housing 78. When the housings 78 are abutted against the backplane 12, the grounded metal of the housing 78 and the metal support plate 58 sandwich the conductor sets 18, 20, and 22 between shielding metal surfaces.

The hanger mechanism, formed by the hook 76 and horizontal catch plates 62, allows a pivoting motion 79 of the motor control modules so that the module connectors 44 and backplane connectors 46 may be engaged simply by rocking the motor control module downward after the hook 76 is engaged with the horizontal catch plates 62. This pivoting allows the readily visible upper edge of the motor control modules to be engaged first to provide vertical alignment of the module connectors 44 and backplane connectors 46 without the latter being visible.

Extending from the metal support plate 58 are guide pins 70, at least one for each station. The guide pins 70 may engage in elliptical holes 80 in the rear face of the housing 78 and main control module 14 to locate the motor control module 14, 16, or 17 longitudinally prior to engagement of the module connector 44 and the backplane connector 46.

A threaded boss 82 extends outward from the metal support plate 58 near its bottom edge to receive a threaded extension screw 84 captive in each motor control module 14, 16, and 17. The threaded extension screw 84 extends through the motor control module 14, 16, or 17 so that its head 86 is exposed at a front surface of the housing 78 of the motor control module 14, 16, or 17. When the extension screw 84 is tightened within the threaded boss 82, it provides yet an additional grounding point of the housing 78 through the extension screw 84 as it connects the housing 78 to the threaded boss 82 which is staked to the metal support plate 58.

Figure 5:
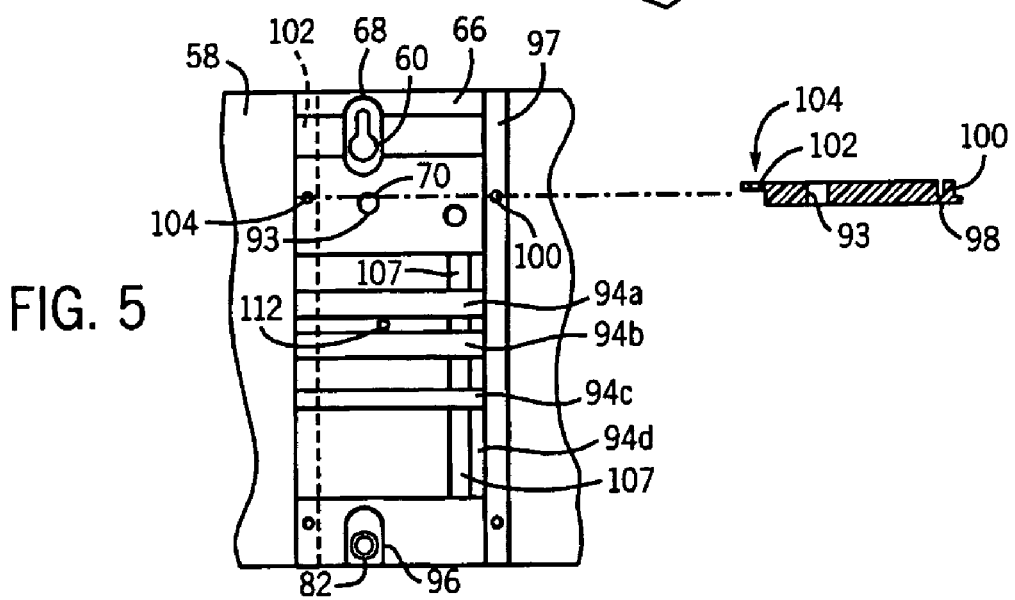
FIG. 5 is a front elevational view of one section of the insulating support of FIG. 4 as is constructed in modular form, aligned with a single cross-section through the module insulating support.

Referring to FIGS. 2, 4, and 5, the front face of the metal support plate 58 is partially covered by an insulating support 66 having apertures 68 exposing mounting holes 60, holes 93 passing guide pins 70, and a notches 96 exposing threaded boss 82.

As can best be seen in FIG. 5, the insulating support 66 is modular for each station along the backplane 12. A right side of each module includes a half height lower lip 97 having upwardly projecting pins 100 whereas the left side includes a half height upper lip 102 having holes 104 corresponding to the pins 100. Accordingly, modules of the insulating support 66 may be snapped together edgewise with other modules of the insulating support 66 to extend arbitrary, longitudinal distances. This modular form allows a single molded part to be reproduced to allow for a variety of different backplane lengths. Typically, standard backplane lengths of 2, 4, 6, and 8 may be produced. For motor control systems 10 having odd numbers of axes, a dummy module 17 having only a housing 78 and a jumpered module connector 44 may be used (as will be described below).

Each module includes four transversely spaced grooves 94a, 94b, 94c, and 94d extending longitudinally across its face. A deeper transverse groove 107 extends within grooves 94a–94d providing relief for rearward connector pins as will be described.

Referring now to FIG. 4, each of the transverse grooves 94a–94d may receive one or more components of conductor sets 18, 20, and 22. The upper groove 94a may receive a copper power rail 106a being, in the preferred embodiment, approximately 1/16 of an inch thick and 3/4 inch tall providing a cross-sectional area of approximately 0.04 square inches sufficient to handle peak currents of up to 200 amps and constant currents of 70 amperes at voltages of up to 800 volts. A second power rail 106b is also provided fitting into transverse grooves 94c. Generally the power rails will be able to handle in excess of 1000 watts and thus are readily distinguished from standard printed circuit traces.

These power rails 106a and 106b are placed on either side of a ground rail 108 being approximately 1/16 of an inch thick and 1/2 inch tall providing a cross-sectional area of approximately 0.03 square inches. The ground rail 108 fits within transverse grooves 94b and may have a hole 110 receiving a screw 112 that may pass through the ground rail 108 and through the insulating support 66 through hole 110 to be received in a threaded hole (not shown) in the metal support plate 58 thus tying the ground of the metal support plate 58 to the ground of the high power conductor set 18. The power rails 106a, 106b, and ground rail 108 together form the high power conductor set 18.

Figure 6:
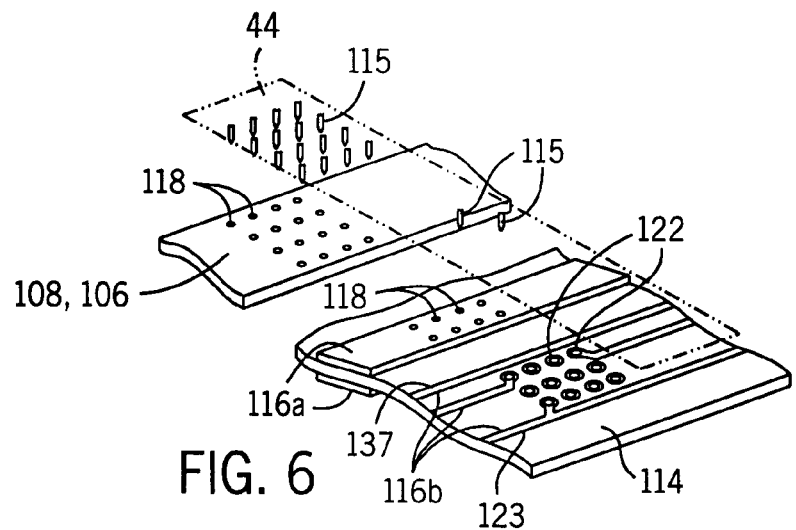
FIG. 6 is a perspective fragmentary exploded view in partial phantom of one connector of the backplane having press fit pins to connect it to metal bars and printed circuit board traces forming the high and low power connections.

Referring to FIGS. 4 and 6, beneath the power rails 106a, 106b and ground rail 108, is a longitudinally extending printed circuit board 114 having on its surface a variety of conductive traces 116 formed by conventional printed circuit techniques. The traces 116 include power traces 116a for conducting low power, for example, less than 110 volts and less than one ampere which provide the low power conductor set 20. The power traces 116a may include corresponding traces on the top and bottom of the printed circuit board 114 joined by the plate-through holes 122 to increase current carrying capacity.

The traces 116 also include data traces 116b which provide for the transmission of data signals including at least one continuity trace 137 for determining the presence of a complete set of motor control modules 14, 16, and 17 and at least one serial communication trace 123 implementing the serial network.

Module connectors 44 extend transversely to span the power rails 106a, 106b, and ground rail 108 and the printed circuit board 114 to connect electrically therewith. Module connectors 44 may include large aperture connection sockets for high power transmission and small aperture sockets for low power transmission. Alternatively, several different connectors (a connector set) may be used to provide the necessary power transmission. A suitable single connector is Multi-Beam XL Power Distribution Connector System manufactured by Tyco international Ltd. under the AMP brand name.

Referring to FIG. 6, a rearward side of the module connectors 44 includes pins 115 which may be press fit into corresponding holes 118 in the power rails 106 and ground rail 108 to create a (gas-tight) electrical junction therebetween without the aid of solder. Similar pins 115 may be received by plate-through holes 122 in the printed circuit board 114 to make an electrical connection with traces 116 on its surfaces. The data traces 116b typically join with a single pin of the module connectors 44 whereas multiple pins 115 communicate with a single power trace 116a. Alternatively, solder connections can be used.

Referring again to FIG. 4, the pins 115 may be received in the transverse groove 107 allowing the printed circuit board 114 and power rails 106 and ground rail 108 to lie in the transverse grooves 94a–94d without interference.

Referring again to FIG. 4, an insulating cover sheet 130 fits over the front, lower portion of the insulating Support 66 covering the conductor sets 18, 20, and 22 held therein but exposing the transversely oriented backplane connectors 46 through apertures 132. The insulating cover sheet 130 has additional apertures 134 for exposing guide pins 70 and threaded boss 82 and may be held in place by angle iron 140 attached by screws 142 passing through the angle iron 140, the insulating cover sheet 130, and the insulating support 66 into threaded holes in metal support plate 58. The angle iron 140 includes a hole 143 allowing access to the threaded boss 82 by the extension screw 84 and provides a ground path between the housing 178 of the motor control modules and the metal support plate 58.

Figure 7:
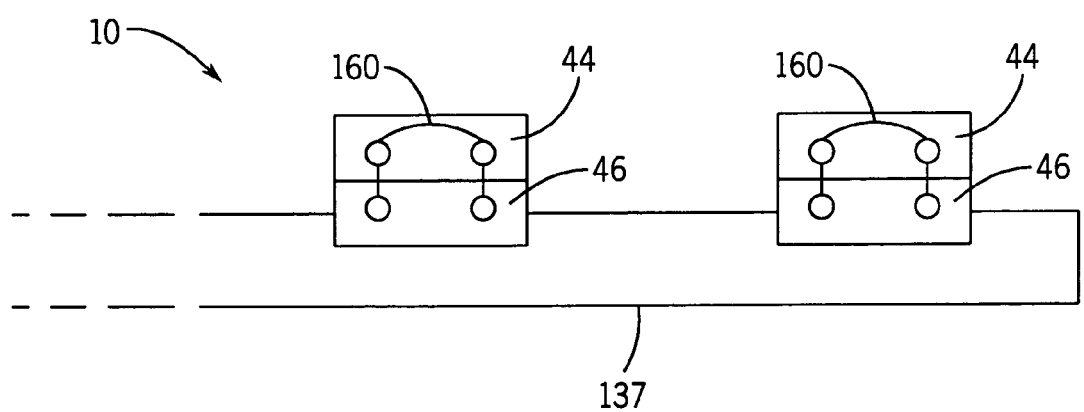
FIG. 7 is a schematic representation of one low power conductor of the backplane used to ensure full population of the backplane with motor control modules.

Referring now to FIGS. 6 and 7, continuity trace 137 provides a loop extending the length of the backplane 12 broken at each backplane connector 46 by its connection to two separate connector sockets. Jumpers 160 in each of the module connectors 44 join the separate sockets of backplane connectors 46 completing the continuity of the loop formed by continuity trace 137. In this way, the continuity trace 137 may be used to determine that each of the backplane connectors 46 has a corresponding module connector 44 attached to it and thus that the high power of the backplane 12 accessible at the backplane connectors 46 is shielded either by an actual main control module 14 and axis control module 16, or a dummy module 17 as has been described. Other methods of determining the presence of a module can be used including responses transmitted on the serial communication trace 123 or dedicated traces connected with each backplane connector 46.

It is specifically intended that the present invention not be limited to the embodiments and illustrations contained herein, but include modified forms of those embodiments including portions of the embodiments and combinations of elements of different embodiments as come within the scope of the following claims.

I claim:
1. A motor controller system comprising:
at least one motor control module generating a drive signal for controlling an electric motor, the motor control modules having a rear face exposing a first connector for receiving electrical power to produce the drive signal and receiving data signals for controlling the drive signal;
a backplane having:
(a) an insulating support;
(b) a set of high power conductors extending longitudinally along the insulating support and providing high power transmission capacity;
(c) a set of low power conductors displaced from the high power conductors and extending longitudinally along the insulating support; and
(d) second connectors spaced longitudinally along the insulating support and extending over the high and low power conductors and joined therewith, the first connector joinable with one of the second connectors.

2. The motor controller system of claim 1 wherein the high power conductors are discrete metal bars and the low power conductors are traces on a printed circuit board.

3. The motor controller system of claim 2 wherein the insulating support provides grooves to receive the metal bars to provide insulating material therebetween.

4. The motor controller system of claim 2 wherein the second connectors include rearwardly extending pins press fit into corresponding holes in the metal bars to electrically join the pins to the metal bars without soldering.

5. The motor controller system of claim 2 wherein the second connectors include rearwardly extending pins press fit into corresponding plate-through holes in the printed circuit board communicating with the traces to electrically join the pins to the traces on the printed circuit board without soldering.

6. The motor controller system of claim 2 wherein a cross-sectional area of at least one of the bars is greater than 0.01 square inches.

7. The motor controller system of claim 1 wherein the power conductors are three conductors providing independent ground and power lines.

8. The motor controller system of claim 2 wherein the printed circuit board includes traces on the front and back sides.

9. The motor controller system of claim 2 wherein the printed circuit board includes plate-through holes joining selected corresponding traces on front and back sides in parallel for greater current carrying capacity.

10. The motor controller system of claim 1 wherein the low power conductors include data conductors and low power conductors.

11. The motor controller system of claim 10 wherein the data conductors include at least one conductor joining each of the second connectors to provide a common serial communications line and wherein the motor control modules include serial communications circuitry.

12. The motor controller system of claim 11 further comprising serial communications circuitry configured to employs a CAN protocol to communicate over the common serial communications line.

13. The motor controller system of claim 1 further include a cover insulating sheet covering the low and high power conductors and including apertures for exposing the second connectors.

14. The motor controller system of claim 1 further including a hanger system on the backplane and motor controller modules supporting the weight of the motor control modules independently of the joining of the first and second connectors.

15. The motor controller system of claim 14 wherein the hanger system is a hook and catch, one at an upper edge of the rear face of the motor control module engaging the other at an upper edge of the backplane allowing a pivoting joining of the first and second connectors about a pivot point at the hook and catch.

16. The motor controller system of claim 1 wherein the rear face of the modules supports a screw engaging a threaded hole in the backplane to lock the motor control module into position.

17. The motor controller system of claim 16 wherein the screw is an extension screw passing through the control module to have a screw head accessible at a front of the control module.

18. The motor controller system of claim 1 wherein the backplane further includes a metal plate positioned behind the insulating support providing a ground plane to the high and low power conductors.

19. The motor controller system of claim 18 wherein at least one power conductor is a ground conductor and wherein the ground conductor is joined to the metal plate and to a housing of the motor control module.

20. The motor controller system of claim 18 further including a hanger system on the backplane and motor controller modules supporting the weight of the motor control modules independently of the joining of the first and second connectors, the hanger system providing an electrical connection between a conductive housing of the motor control module and the metal plate.

21. The motor controller system of claim 1 wherein the low power conductor includes a series conductor connecting each of the second connectors and wherein the first connector includes a shorting conductor providing continuity to the series conductor when each of the second connectors is joined to a first connector.

22. The motor controller system of claim 1 wherein the insulating support is modular to support at least one second connector and associated high power conductors and low power conductors; and
wherein the insulating support may be assembled to provide for motor control systems having different numbers of motor control modules.

23. The motor controller system of claim 18 wherein the metal plate further includes an alignment surface interfitting with a corresponding alignment surface of the motor control module to guide the motor control module into alignment with the second connector prior to engagement of the first and second connectors.

24. A motor control module for use with a backplane having an insulating support, a set of high power conductors extending longitudinally along the insulating support and providing high power transmission capacity, a set of low power conductors displaced from the high power conductors and extending longitudinally along the insulating support, and second connectors spaced longitudinally along the insulating support and extending over the high and low power conductors and joined therewith, the first connector joinable with one of the second connectors, the motor control module comprising:
a rear face exposing a transversely extending first connector for receiving electrical power from the backplane to produce a motor drive signal and data signals for controlling the drive signal;

a hanger positioned at an upper edge of the rear face supporting the weight of the motor control module independently of the joining of the first connector with a second connector on the backplane wherein the hanger allows a pivoting joining of the first and second connectors about at the upper edge of the rear face; and a screw supported by the motor control module and engaging a threaded hole in the backplane to lock the motor control module into position with the first connector joined with the second connector.

25. The motor controller module of claim 24 wherein the screw is an extension screw passing through the control module to have a screw head accessible at a front of the control module.

26. The motor control module of claim 24 wherein the rear face further includes at least one receptacle configured to receive a guide pin to align the first connector to be joined with the second connector.

27. A kit for the creation of a motor control comprising:

at least one motor control module generating a drive signal for controlling an electric motor, the at least one motor control modules having a rear face exposing a first connector for receiving electrical power to produce the drive signal and receiving data signals for controlling the drive signal;

at least one dummy module having a rear face exposing a second connector;

a backplane having:

(a) an insulating support;

(b) a set of high power conductors extending longitudinally along the insulating support;

(c) a set of low power conductors displaced from the high power conductors and extending longitudinally along the insulating support;

(d) third connectors spaced longitudinally along the insulating support and extending over the high and low power conductors and joined therewith, the first connector and the second connector joinable with respective ones of the third connectors; and (e) means for detecting that each of the third connectors is joined with one of a the first connector or the second connector.

28. A system for sharing power among a plurality of electronic modules, each module having a first connector exposed at a rear face thereof, the system comprising:

(a) an insulating support;

(b) a set of high power conductors extending along the insulating support;

(c) a set of low power conductors displaced from the high power conductors and extending along the insulating support;

(d) a set of data conductors displaced from the high power and low power conductors and extending along the insulating support;

(e) second connectors spaced along the insulating support, low power and data conductors and electrically connected thereto, the first connector joinable with one of the second connectors; and (f)) a support means for engaging the rear face of the modules to support and align the modules before and after the first and second connectors are engaged.

29. The system for sharing power of claim 28 wherein the support means allows a pivoting of an engaging module about an upper edge of the rear face of the engaging module.

30. The system for sharing power of claim 28 wherein the support means are apertures receiving downwardly engaging hooks at an upper edge of the rear face of the modules.

31. The motor controller system of claim 28 wherein the set of high power conductors are discrete metal bars and the set of low power conductors and the set of data conductors are traces on a printed circuit board.

* * * * *